United States Patent
Nakamura et al.

(10) Patent No.: US 7,208,062 B2
(45) Date of Patent: Apr. 24, 2007

(54) METHOD OF PRODUCING MULTILAYER PRINTED WIRING BOARD

(75) Inventors: Shigeo Nakamura, Kawasaki (JP); Tadahiko Yokota, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 10/849,172

(22) Filed: May 20, 2004

(65) Prior Publication Data

US 2005/0005437 A1    Jan. 13, 2005

Related U.S. Application Data

(63) Continuation of application No. PCT/JP02/12442, filed on Nov. 28, 2002.

(30) Foreign Application Priority Data

Nov. 30, 2001    (JP)    ............... 2001-367232

(51) Int. Cl.
   *C09J 163/00*    (2006.01)
   *B32B 37/14*    (2006.01)
(52) U.S. Cl. .................. 156/153; 156/239; 156/307.1; 156/330; 174/255; 174/259; 428/355 EP; 428/901
(58) Field of Classification Search ............. None
   See application file for complete search history.

(56) References Cited

FOREIGN PATENT DOCUMENTS

| EP | 851726 A2 | * | 7/1998 |
|---|---|---|---|
| EP | 1 092 739 | | 4/2001 |
| JP | 8-316642 | | 11/1996 |
| JP | 10-226770 | * | 8/1998 |
| JP | 11-87927 | | 3/1999 |
| JP | 11-296074 | | 4/2001 |
| JP | 2001-119150 | | 4/2001 |

* cited by examiner

*Primary Examiner*—Jeff H. Aftergut
*Assistant Examiner*—Barbara J Musser
(74) *Attorney, Agent, or Firm*—Oblon, Spivak, McClelland, Maier & Neustadt, P.C.

(57) ABSTRACT

Adhesive films which are useful for preparing laminated circuit boards may be produced by laminating a resin composition layer made of a layer A and layer B on a support base film, in which
  layer A is a layer of a thermosetting resin composition that has an inorganic filler content of from 0 to less than 40% by weight, has a cured surface which after roughening, allows forming a conductor layer by plating, and is solid at ambient temperature,
  layer B is a layer of a thermosetting resin composition that has an inorganic filler content of 40% by weight or more, and is solid at ambient temperature,
  layer A is laminated adjacent to the support base film, and
  layer B layer has a fluidity that allows the filling of a resin into a through hole and/or a via hole.

33 Claims, 2 Drawing Sheets

METHOD OF PRODUCING MULTILAYER PRINTED WIRING BOARD

CROSS REFERENCES TO RELATED APPLICATIONS

This application is a continuation of International Patent Application No. PCT/JP02/12442, filed on Nov. 28, 2002, and claims priority to Japanese Patent Application No. 2001-367232, filed on Nov. 30, 2001, both of which are incorporated herein by reference in their entireties.

BACKGROUND OF THE INVENTION

1. Field of the Invention

The present invention relates to methods of producing a multilayer printed wiring board according to a build-up technique in which a circuit-formed conductor layer and an insulating layer are alternately stacked. The present invention also relates to methods of laminating a circuit board with an adhesive film in the production of a multilayer printed wiring board. The present invention further relates to methods of forming an insulating layer by heating and curing a resin composition layer that is introduced after lamination. The present invention also relates to an adhesive film which is useful in such methods.

2. Discussion of the Background

In recent years, the production of multilayer printed wiring boards according to a build-up technique in which a circuit-formed conductor layer and an insulating layer are alternately stacked has gathered attention. When a multilayer printed wiring board is produced according to the build-up technique, as a method of forming an insulating layer, a method is known in which the resin composition is laminated on a circuit board by vacuum lamination with an adhesive film having a layer of a resin composition having a particular composition and physical properties, as disclosed in, for instance, JP-A No. 11-87927.

Furthermore, with the advance toward smaller size and higher performance of electronic apparatus, build-up layers are formed in higher multiples. Accordingly, there is a strong demand for multilayer printed wiring boards that have a multistage via structure called a staggered via or a stacked via in which via holes are connected over a plurality of build-up insulating layers. When a multilayer printed wiring board has such via structures, there occurs a problem in that since the thermal expansion coefficient of a copper wiring connecting the via holes and that of an insulating layer are very different, cracks or the like are generated in the copper wiring or the insulating layer, when a reliability test such as a thermal cycle test or the like is conducted. Accordingly, there is an urgent demand to lower the thermal expansion coefficient of the resin composition which constitutes the build-up insulating layer. As means for lowering the thermal expansion coefficient low, it is generally known to add an inorganic filler in the resin composition. When a larger amount of the inorganic filler is added, the thermal expansion coefficient can be lowered correspondingly.

At present, a carbon dioxide gas laser is mainly used in forming a via hole in an insulating layer. However, when a large amount of inorganic filler is present in the insulating layer, there are problems in via shape and processing speed, because the thermal decomposition temperature upon laser processing is different between the resin and the inorganic filler. For instance, the above-mentioned JP-A No. 11-87927 discloses that the content of the inorganic filler is preferably 30% by weight or less from a viewpoint of the laser processability. However, the progress of the carbon dioxide gas laser and the introduction of UV-YAG lasers into this field are remarkable; accordingly, at present, even the resin composition in which a large amount of inorganic filler is contained can be processed without particular problems.

On the other hand, in the build-up technique, as a plating method suitable for forming a high density wiring, there is a method where after roughening a surface of an insulating layer with an alkaline permanganic acid solution, a conductor layer is formed by means of plating (the above-cited JP-A No. 11-87927). However, when a large amount of inorganic filler is contained in the insulating layer, on a roughened surface, the inorganic filler is exposed a lot. Accordingly, there is the problem that a conductor layer formed by the plating does not exhibit good adhesion.

Furthermore, as to the inorganic filler that is used, in order to avoid the problem of large pores forming when coarse particles come off the surface of the insulating layer during surface roughening, and, as a result, a deterioration in the yield of a high density wiring having excellent adherence formed on the insulating layer, a fine inorganic filler, from which coarse particles having a large particle diameter are highly classified and removed, and which has an average particle diameter in the range of substantially from 0.1 to 10 µm is necessary to be used. However, since the highly classified inorganic filler is expensive, it is desired to use less from this point of view.

Thus, there remains a need for adhesive films which are useful for forming multilayer printed wiring boards and which do not suffer from the above-described drawbacks.

SUMMARY OF THE INVENTION

Accordingly, it is one object of the present invention to provide a novel lamination method, a novel method of forming an insulating layer and a novel method of producing a multilayer printed wiring board, and furthermore a novel adhesive film which can be used in these methods. According to the present lamination method, when a multilayer printed wiring board is produced according to a build-up technique, an insulating layer which under lamination conditions allows filling a resin into a through hole and/or a via hole simultaneously with laminating a circuit board, which has a low thermal expansion coefficient, and which, after roughening of its surface, is excellent in adhesiveness with a conductor layer which is formed by plating, can be easily introduced.

The present inventors have made investigation earnestly and found that in the production of a multilayer printed wiring board according to the build-up technique, by use of a particular adhesive film that has two kinds of thermosetting resin composition layers in which the amounts of added inorganic fillers are controlled to specific values, the above problems could be overcome. Based on such findings, the present invention has been attained.

That is, the present invention provides:

(1) A process of making a laminated circuit board, comprising laminating a circuit board with an adhesive film, wherein:

the adhesive film is formed by laminating a resin composition layer made of the following layer A and layer B on a support base film; wherein:

layer A is a layer of a thermosetting resin composition that contains an epoxy resin having two or more epoxy groups in one molecule and an epoxy curing agent, has an inorganic filler content of from 0 to less than 40% by weight, has a cured surface obtained by thermally curing which, after roughening with an alkaline permanganic acid solution, allows forming a conductor layer by plating, and is solid at ambient temperature;

layer B is a layer of a thermosetting resin composition that contains an epoxy resin having two or more epoxy groups in one molecule and an epoxy curing agent, has an inorganic filler content of 40% by weight or more, and is solid at ambient temperature;

layer A is laminated adjacent to the support base film;

the resin composition layer or the B layer, under lamination conditions, has a fluidity capable of filling a resin in a through hole and/or a via hole simultaneously with laminating a circuit board; and the laminating of the circuit board with the adhesive film is carried out while keeping the layer B directly in contact with the circuit board.

(2) A process of making a laminated circuit board as set forth in (1) wherein the layer B includes 10% by weight or more of a resin of which the softening point is lower than the lamination temperature.

(3) A process of making a laminated circuit board as set forth in (1) wherein the layer B includes a component that is liquid at ambient temperature in an amount of from 5 to 55% by weight.

(4) A process of making a laminated circuit board as set forth in (1) wherein the layer B includes a polymer compound having a weight average molecular weight in the range of from 5,000 to 100,000 in an amount of from 5 to 50% by weight.

(5) A process of making a laminated circuit board as set forth in (1) wherein the lamination conditions are a temperature of from 70 to 140° C., a pressure of from 1 to 20 kgf/cm$^2$, and an air pressure of 20 mmHg or less.

(6) A process of making a laminated circuit board as set forth in (1) wherein the thickness of the layer A is in the range of from 1 to 20 μm and the thickness of the layer B is from 10 to 100 μm.

(7) A process of making a laminated circuit board as set forth in (1) wherein the layer B is adjacent to the layer A.

(8) A process of making a laminated circuit board as set forth in (1) wherein the layer B is protected with a protective film and a step of peeling the protective film before laminating to the circuit board is included.

(9) A process of making a laminated circuit board wherein after an adhesive film is laminated on both surfaces or a single surface of the circuit board according to any one of the lamination methods set forth in (1) through (8), the support film is peeled off if necessary, the laminated adhesive film is thermally cured, and thereby an insulating layer is formed.

(10) A process of making a multilayer printed wiring board wherein after the insulating layer is formed on the circuit board according to the method of forming an insulating layer set forth in (9), the following steps (i) through (v) are sequentially carried out;

(i) peeling a support film when the support film is present, (ii) drilling the circuit board thereon the insulating layer is formed, (iii) roughening a surface of the insulating layer with an alkaline permanganic acid solution, (iv) forming a conductor layer on the roughened surface of the insulating layer by a plating, and (v) forming a circuit in the conductor layer.

(11) A process of making a multilayer printed wiring board wherein the multilayer printed wiring board goes through any one of the lamination methods set forth in (1) through (8).

(12) A process of making a multilayer printed wiring board wherein the multilayer printed wiring board goes through the method of forming an insulating layer set forth in the (9).

(13) A multilayer printed wiring board wherein the multilayer printed wiring board is formed by going through any one of the lamination methods set forth in the (1) through (8).

(14) A multilayer printed wiring board wherein the multilayer printed wiring board is formed by going through the method of forming an insulating layer set forth in the (9).

(15) A multilayer printed wiring board wherein the multilayer printed wiring board is produced according to the producing method set forth in (10).

(16) A process of making a laminated circuit board, comprising laminating a circuit board with an adhesive film, wherein:

the adhesive film is formed by laminating a resin composition layer made of the following layer A and layer B on a support base film;

layer A is a layer of a thermosetting resin composition that contains an epoxy resin having two or more epoxy groups in one molecule and an epoxy curing agent, has an inorganic filler content of from 0 to less than 40% by weight, has a cured surface obtained by thermally curing which, after roughening with an alkaline permanganic acid solution, allows forming a conductor layer by plating, and is solid at ambient temperature;

layer B is a layer of a thermosetting resin composition that contains an epoxy resin having two or more epoxy groups in one molecule and an epoxy curing agent, has an inorganic filler content of 40% by weight or more, and is solid at ambient temperature;

layer A is laminated adjacent to the support base film;

the resin composition layer or the B layer has the melt viscosity, when it is heated with a measurement start temperature of 60° C. and a temperature rise rate of 5° C./minute, in the range of from 4,000 to 50,000 poise at 90° C., from 2,000 to 21,000 poise at 100° C., from 900 to 12,000 poise at 110° C., from 500 to 9,000 poise at 120° C. and from 300 to 15,000 poise at 130° C.; and the laminating of the circuit board with the adhesive film is carried out while keeping the layer B directly in contact with the circuit board.

(17) A process of making a laminated circuit board as set forth in (16) wherein the lamination conditions are a in temperature of from 70 to 140° C., a pressure of from 1 to 20 kgf/cm$^2$, and an air pressure of 20 mmHg or less.

(18) A process of making a laminated circuit board as set forth in (16) wherein the thickness of the layer A is in the range of from 1 to 20 μm and the thickness of the layer B is from 10 to 100 μm.

(19) A process of making a laminated circuit board as set forth in (16) wherein the layer B is adjacent to the layer A.

(20) A process of making a laminated circuit board as set forth in (16) wherein the layer B is protected with a protective film and a step of peeling the protective film before the lamination to the circuit board is included.

(21) A process of making a laminated circuit board wherein after an adhesive film is laminated on both surfaces or a single surface of the circuit board according to any one of lamination methods set forth in (16) through (20), the support film is peeled if necessary, the laminated adhesive film is thermally cured, and thereby an insulating layer is formed.

(22) A process of making a multilayer printed wiring board wherein after the insulating layer is formed on a circuit board according to the method of forming an insulating layer set forth in (21), the following steps (i) through (v) are sequentially carried out;

(i) peeling a support film when the support film is present, (ii) drilling the circuit board thereon the insulating layer is formed, (iii) roughening a surface of the insulating layer with an alkaline permanganic acid solution, (iv) forming a conductor layer on the roughened surface of the insulating layer according to the plating, and (v) forming a circuit in the conductor layer.

(23) A process of making a multilayer printed wiring board wherein the multilayer printed wiring board goes through any one of the lamination methods set forth in (16) through (20).

(24) A process of making a multilayer printed wiring board wherein the multilayer printed wiring board goes through the method of forming an insulating layer set forth in (21).

(25) A multilayer printed wiring board wherein the multilayer printed wiring board is produced by any one of the lamination methods set forth in (16) through (20).

(26) A multilayer printed wiring board wherein the multilayer printed wiring board is formed by the method of forming an insulating layer set forth in (21).

(27) A multilayer printed wiring board characterized in that the multilayer printed wiring board is produced according to the producing method set forth in (22).

(28) An adhesive film for a multilayer printed wiring board, which is formed by laminating a resin composition layer made of the following layer A and layer B on a support base film; wherein:

layer A is a layer of a thermosetting resin composition that contains an epoxy resin having two or more epoxy groups in one molecule and an epoxy curing agent, has an inorganic filler content of from 0 to less than 40% by weight, has a cured surface obtained by thermally curing that, after roughening with an alkaline permanganic acid solution, allows forming a conductor layer by plating, and is solid at ambient temperature;

layer B is a layer of a thermosetting resin composition that contains an epoxy resin having two or more epoxy groups in one molecule and an epoxy curing agent, has an inorganic filler content of 40% by weight or more, and is solid at ambient temperature;

layer A laminated adjacent to the support base film;

the resin composition layer or the B layer has the melt viscosity, when it is heated with a measurement start temperature of 60° C. and a temperature rise rate of 5° C./minute, in the range of from 4,000 to 50,000 poise at 90° C., from 2,000 to 21,000 poise at 100° C., from 900 to 12,000 poise at 110° C., from 500 to 9,000 poise at 120° C. and from 300 to 15,000 poise at 130° C.

(29) An adhesive film for use in multilayer printed wiring boards as set forth in (28) wherein the thickness of the layer A is in the range of from 1 to 20 μm and the thickness of the layer B is from 10 to 100 μm.

(30) An adhesive film for use in multilayer printed wiring boards set forth in (28) wherein the layer B is adjacent to the layer A.

(31) An adhesive film for use in multilayer printed wiring boards set forth in (28) wherein the layer B is protected with a protective film.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Thus, in a first embodiment, the present invention provides novel adhesive films for multilayer printed wiring boards in which a layer of resin compositions made of a layer A and a layer B below is laminated on a support film with the A layer laminated adjacent to a support base film.

Layer A is a layer of a thermosetting resin composition that contains an epoxy resin having two or more epoxy groups in one molecule and an epoxy curing agent, has an inorganic filler content of from 0 to less than 40% by weight, has a cured surface obtained by thermally curing that after the roughening with an alkaline permanganic acid solution, allows forming a conductor layer by plating, and is solid at ambient temperature.

Layer B is a layer of a thermosetting resin composition that contains an epoxy resin having two or more epoxy groups in one molecule and an epoxy curing agent, has an inorganic filler content of 40% by weight or more, and is solid at ambient temperature.

The thermosetting resin compositions that constitute the layer A and the layer B each contain an epoxy resin that has two or more epoxy groups in one molecule (component (a)) and an epoxy curing agent (component (b)).

The "epoxy resin that has two or more epoxy groups in one molecule," for component (a), includes epoxy resins such as bisphenol A type epoxy resins, bisphenol F type epoxy resins, phenol novolak type epoxy resins, bisphenol S type epoxy resins, alkylphenol novolak type epoxy resins, bisphenol type epoxy resins, naphthalene type epoxy resins, dicyclopentadiene type epoxy resins, epoxidation products of condensation products between phenols and aromatic aldehydes having a phenolic hydroxyl group, triglycidyl isocyanurate, and alicyclic epoxy resins, having two or more epoxy groups in one molecule. The epoxy resins may be ones that are, in order to provide flame resistance, subjected to bromination, phosphorus degeneration and so on.

As the epoxy resin of the component (a), aromatic epoxy resins having an aromatic ring skeleton in a molecule are preferable. Furthermore, the epoxy resin of the component (a) may be either an epoxy resin which is solid at ambient temperature or an epoxy resin which is liquid at ambient temperature. Specific examples of such epoxy resins include, for instance, ones used in Examples described later. In the present invention, the term ambient temperature indicates a temperature in the range of from 20 to 30° C.

As the "epoxy curing agent", for component (b), among amine-based curing agents, guanidine-based curing agents, imidazole-based curing agents, phenolic curing agents, acid anhydride-based curing agents, or epoxy adducts or microencapsulated ones thereof, ones that start a curing reaction at a temperature higher than the lamination temperature are selected. Furthermore, these curing agents are preferred to be longer in pot life. Two or more kinds of epoxy curing agents may be used in combination.

Specific example of the epoxy curing agents include dicyandiamide, 2-phenyl-4-methyl-5-hydroxymethyl imidazole, 2-phenyl-4,5-bis(hydroxymethyl)imidazole, 2,4-dicyano-6-(2-methyl-1-imidazorylethyl)-1,3,5-triazine.isocyanuric acid adduct, 2,4-diamino-6-(2-undecyl-1-imidazorylethyl)-1,3,-5-triazine, and so on.

As the epoxy curing agent, phenolic curing agents having a nitrogen atom are particularly preferable. When the phenolic curing agent that contains a nitrogen atom is used, effects of improving the heat resistance, the flame resistance, and the adhesiveness of the insulating layer can be obtained. Such epoxy curing agents include, for instance, novolak resins containing a triazine structure (for instance, "Phenolite 7050" Series manufactured by Dainippon Ink and Chemicals, Inc.), melamine-modified phenol novolak resins (for instance, "YLH828" manufactured by Japan Epoxy Resin Co., Ltd.) and so on.

When the epoxy curing agent in the thermosetting resin composition is an amine-based curing agent, a guanidine-based curing agent, or an imidazole-based curing agent, it is usually used in the range of from 2 to 12% by weight, and in the case of the phenolic curing agent or acid anhydride-based curing agent, the phenolic hydroxyl group equivalent or acid anhydride equivalent is usually in the range of from 0.5 to 1.3 equivalents with respect to one epoxy group equivalent of the epoxy resin contained in the thermosetting resin composition.

Furthermore, in addition to the epoxy curing agent, a curing accelerator may be added. Such curing accelerators include imidazole compounds, organic phosphine compounds and so on. Specific examples of such curing accelerators include, for instance, 2-methyl imidazole, triphenyl phosphine and so on. When the curing accelerator is used, it can be preferably used in the range of from 0.5 to 2% by weight relative to the epoxy resin contained in the thermosetting resin composition.

The layer A in the adhesive film according to the invention is made of a thermosetting resin composition that contains the components (a) and (b), contains an inorganic filler in an amount of from 0 to less than 40% by weight, has a cured surface obtained by thermally curing that allows, after surface roughening with an alkaline permanganic acid solution, forming a conductor layer by plating, and is solid at ambient temperature.

The content of the inorganic filler relative to the thermosetting resin composition (100% by weight) that constitutes the layer A is set in the range of from 0 to less than 40% by weight, based on the total weight of layer A. When it exceeds 40% by weight, the inorganic filler is largely exposed on a surface of the insulating layer after the surface roughening. Accordingly, it becomes difficult to obtain a conductor layer with a high adhesiveness by means of plating. This is because a large amount of the inorganic filler deteriorates the anchor shapes formed after the surface roughening, and a surface of the inorganic filler is endowed with the plating catalyst with difficulty.

The inorganic fillers include silica, alumina, barium sulfate, talc, clay, mica powder, magnesium hydroxide, boron nitride, aluminum borate, barium titanate, strontium titanate, calcium titanate, magnesium titanate, bismuth titanate, titanium oxide, barium zirconate, calcium zirconate and so on. Among these, silica and alumina can be preferably used.

Although the content of the inorganic filler in the layer A is, as mentioned above, in the range of from 0 to less than 40% by weight, the content is preferably in the range of from 1 to 35% by weight, and more preferably from 5 to 25% by weight, based on the total weight of layer A. Furthermore, from a viewpoint of densely forming wirings when forming a circuit, the inorganic filler is preferably one that has an average particle diameter in the range of substantially from 0.1 to 10 μm and from which coarse particles of 10 μm or larger are highly classified and removed. In particular, one in which particles of 10 μm or larger in the particle diameter are classified to 100 ppm or less is preferable, and furthermore the inorganic filler having an average particle diameter in the range of from 0.1 to 6 μm is preferable.

Still furthermore, the layer A according to the invention has a cured surface obtained by thermally curing that allows, after the surface roughening with an alkaline permanganic acid solution, forming a conductor layer by plating.

In order to be able to roughen the cured surface with an alkaline permanganic acid solution, the layer A may be added with, as a roughening component, either an inorganic filler soluble in the alkaline permanganic acid solution such as calcium carbonate, magnesium carbonate, magnesium oxide, aluminum hydroxide and so on, or a rubber component, amino resin, organic filler, phenoxy resin and so on.

The rubber components include polybutadiene rubbers, epoxidated polybutadiene rubbers, urethane-modified polybutadiene rubbers, acrylonitrile-modified polybutadiene rubbers, methacrylonitrile-modified polybutadiene rubbers, acrylonitrile butadiene rubbers having a carboxyl group, methacrylonitrile butadiene rubbers having a carboxyl group, acrylic rubber dispersed epoxy resins and so on.

The amino resins include, amino resins such as melamine resins, guanamine resins, urea resins and so on or ones that are obtained by alkyl etherifying these amino resins.

The organic fillers include powdery epoxy resin, crosslinked acrylic polymers, ones obtained by thermally curing the amino resins followed by finely pulverizing and so on.

The phenoxy resins include phenoxy resins such as "Phenototo YP50" (manufactured by Toto Kasei Co., Ltd.), "E-1256" (manufactured by Japan Epoxy Resin Co., Ltd.) and so on and brominated phenoxy resins such as "YPB-40-PXM40" (manufactured by Toto Kasei Co., Ltd.) and so on.

The content in the layer A of the roughening component that is also the inorganic filler is preferably in the range of from 5 to less than 40% by weight, and more preferably in the range of from 10 to 30% by weight, based on the total weight of the layer A. When it is less than 5% by weight, in some cases, the roughening is not sufficient. Furthermore, when 40% or more by weight of the inorganic filler is used, there are the same problems as that mentioned above, and also in the other roughening components, after the curing, the insulating properties, the chemical resistance and the heat resistance of the insulating layer tend to deteriorate.

Furthermore, as described in for instance JP-A No. 2001-181375, in the case of an epoxy resin composition that includes an epoxy resin having two or more epoxy groups in one molecule, a phenolic curing agent, a phenoxy resin that has a weight average molecular weight in the range of from 5,000 to 100,000 and a bisphenol S skeleton and a curing accelerator being used as a thermosetting resin composition that constitutes the layer A, even when the roughening component is not included, the roughening with an alkaline permanganic acid solution can be attained.

In order to form the thermosetting resin composition that constitutes the layer A into a film, it is necessary to be solid at ambient temperature (20 to 30° C.).

The thickness of the layer A is preferably in the range of from 1 to 20 μm. When it is less than 1 μm, in some cases, the adhesiveness (peel strength) of the conductor layer formed according to the plating is not sufficient; and when it exceeds 20 µm, the thermal expansion coefficient is unfavorably lowered. It is more preferably in the range of from 5 to 15 µm.

The layer B in the adhesive film according to the invention is constituted of a thermosetting resin composition that contains the components (a) and (b), has an inorganic filler content of 40% or more by weight and is solid at ambient temperature.

For the components (a) and the components (b) and the inorganic filler, the same as that in the layer A can be used. Furthermore, similarly to the layer A, in addition to the epoxy curing agent, a curing accelerator can be also added.

The content of the inorganic filler relative to the thermosetting resin composition (100% by weight) that constitutes the B layer is set at 40% or more by weight. It is preferably in the range of from 40 to 90% by weight, and more preferably from 50 to 80% by weight, based on the total weight of layer B. In the case of layer B, there is no need to use the inorganic filler which has a small average particle diameter and from which coarse particles are highly classified and removed as in the case of layer A. In corresponding to the fineness in a wiring density of a circuit board that is laminated, a filler having an average particle diameter in the range of, for instance, from 0.1 to 30 µm can be used.

The thermosetting resin composition that constitutes the layer B, in order to form into a film similarly to the layer A, is solid at ambient temperature (20 to 30° C.).

In the adhesive film according to the invention, the resin composition layer (made of the layer A and the layer B) or the layer B has a fluidity such that, under the lamination conditions, is capable of filling the resin in a through hole and/or via hole simultaneously with laminating the circuit board.

That is, the adhesive film according to the invention, can be laminated on a circuit board by use of a vacuum lamination, without necessitating the use of a vacuum hot press for a long time period. Furthermore, even when the circuit board has a via hole or a through hole, the adhesive film is softened under the lamination conditions and has the fluidity (resin flow) that allows simultaneously and in lump filling the through holes and via holes present in the circuit board. The through hole that is filled with the resin in a multilayer printed wiring board usually has a depth from 0.1 to 1.5 mm and a diameter usually from 0.1 to 0.8 mm. In the layer B according to the invention, a thermosetting resin composition that enables to fill the resin in the above ranges is usually used. When both sides of a circuit board are laminated, the thermosetting resin composition may have a fluidity that can fill one half the through hole under the lamination conditions. Furthermore, the fluidity such as mentioned above is not necessarily exhibited only by the layer B, but the entire resin composition layer made of the layers A and B may be capable of filling the resin in the through hole or the like.

The lamination conditions used in the vacuum lamination can be usually set at a temperature of from 70 to 140° C., a pressure of from 1 to 20 kgf/cm$^2$, and an air pressure of 20 mm Hg. Furthermore, it is more preferable to set the temperature in the range of from 80 to 120° C., the pressure from 3 to 11 kgf/cm$^2$, and the air pressure at 10 mmHg or less.

In order to achieve, under the lamination conditions, the filling of the resin (usually with the layer B) in the through holes and/or via holes while simultaneously laminating the circuit board, one of the following conditions are adopted.

The thickness of the layer B is usually set at the thickness of the conductor layer or more. A thickness of the conductor layer that the circuit board has is usually in the range of from 5 to 70 µm. However, the thickness of the layer B is preferably in the range of from 10 to 100 µm.

The layer B in the present invention usually contains 10% or more by weight, based on the total weight of the layer B, of a resin that has a softening point lower than the lamination temperature and is solid at ambient temperature. The lamination temperature can be usually set in the range of from 70 to 140° C. as described above. When the resin is contained in an amount of less than 10% by weight, it is difficult to fill the resin in the through holes and the via holes without voids, since the resin does not flow sufficiently during the lamination. The layer B is preferably prepared so that the resin that has a softening point lower than the lamination temperature may be contained in the range of from 10 to 90% by weight, based on the total weight of layer B. When the content exceeds 90% by weight, the fluidity tends to be too high; accordingly, in some cases, it becomes difficult to form a uniform insulating layer by means of the vacuum lamination.

Furthermore, the layer B preferably contains a component that is liquid at ambient temperature (20 to 30° C.) in the range of from 5 to 55% by weight, based on the total weight of the layer B. The component that is liquid at ambient temperature indicates a component that is arbitrarily contained in the thermosetting resin composition and liquid at ambient temperature, and resins, organic solvents and so on that are liquid at ambient temperature can be exemplified.

When the "epoxy resin having two or more epoxy groups in one molecule", the component (a), is liquid, it is included in the resin that is liquid at ambient temperature. Furthermore, for instance, an epoxy resin that can be arbitrarily contained and has one epoxy group in one molecule may also be included in the resin that is liquid at ambient temperature. Still furthermore, when the above-mentioned epoxy curing agent is the resin that is liquid at ambient temperature, it is also included in the resin that is liquid at ambient temperature. Other resins that may be arbitrarily contained and are liquid at ambient temperature are also included in the resin that is liquid at ambient temperature.

As described later, organic solvents are usually used when the layer A and the layer B are formed. Examples of the organic solvent include ketones such as acetone, methyl ethyl ketone, cyclohexanone, and so on; acetic esters such as ethyl acetate, butyl acetate, cellosolve acetate, propylene glycol monomethyl ether acetate, carbitol acetate, and so on; carbitols such as cellosolves, butyl carbitol and so on; aromatic hydrocarbons such as toluene, xylene, and so on; dimethyl formaldehyde; dimethyl acetamide; N-methyl pyrrolidone; and so on. Two or more kinds of these organic solvents may be contained.

When these organic solvents are present in the layer A and the layer B, the contents in the respective layers are usually 10% by weight or less, and preferably 5% by weight or less, based on the total weight of each of layer A and layer B.

When the component that is liquid at ambient temperature is present in an amount of less than 5% by weight, the flexibility and the cutting workability of the adhesive film are not sufficient, and the adhesive film is not preferable from a viewpoint of handling. On the other hand, when it is present in an amount which exceeds 55% by weight, the fluidity at room temperature is high. Thus, the resin may seep out of a cut surface, at roll winding during the manufacture of the adhesive film, and the peelability from a peelable support film and a protective film tends to deteriorate.

The layer B according to the invention may be protected with a protective film as described later. When the layer B is protected with the protective film, a surface of the layer B can be protected from dust and being bruised.

In the layer A and the layer B of the present invention, in addition to the above essential components, if necessary, other thermosetting resins, polymer compounds and additives may be used, to an extent that does not damage the effects of the invention.

As the thermosetting resin, other than mono-functional epoxy resins as diluent, cyanate ester resins, block isocyanate resins, xylene resins, radical generators, polymerizing resins, and so on can be exemplified.

Preferable examples of the polymer compound include phenoxy resins, polyimide resins, polyamide imide resins, polyether imide resins, polysulfone resins, polyether sulfone resins, polyphenylene ether resins, polycarbonate resins, polyetheretherketone resins, polyester resins and so on, all having an weight average molecular weight in the range of from 5,000 to 100,000. When the polymer compound is added, there are advantages in that the layers A and B can be easily prepared so that the resin can be suppressed from flowing during the lamination and the preferable fluidity may be obtained.

In particular, when the adhesive film according to the present invention for use in multilayer printed wiring boards is subjected to vacuum lamination at relatively high temperatures, the fluidity of the resin tends to be too high. However, when the polymer compound is contained in an amount of from 5 to 50% by weight, the layer A and the layer B, can be easily prepared so that the resin can be suppressed from flowing during the lamination and the preferable fluidity may be obtained.

When the weight average molecular weight is less than 5,000, the fluidity cannot be sufficiently suppressed effect; on the other hand, in the case of exceeding 100,000, when the layer of thermosetting resin composition (layer A and layer B) is formed as resin varnish in which the thermosetting resin composition is compounded with the organic solvent, in some cases, the solubility into the organic solvent deteriorates.

As the polymer compound, phenoxy resins are particularly preferable. As the phenoxy resins, phenoxy resins such as "Phenototo YP50" (manufactured by Toto Kasei Co., Ltd.), "E-1256" (manufactured by Japan Epoxy Resin Co., Ltd.) and so on, brominated phenoxy resins such as "YPB-40-PXM40" (manufactured by Toto Kasei Co., Ltd.) and so on, and phenoxy resins having a bisphenol S skeleton such as "YL6747H30" (Japan Epoxy Resin Co., Ltd., cyclohexanone varnish of a phenoxy resin made of bisphenol A type epoxy resin "Epicoat 828" and bisphenol S: having non-volatile component 30% by weight and weight average molecular weight of 47,000) and so on can be exemplified.

The additives include organic fillers such as silicon powder, nylon powder, fluorocarbon polymer powder and so on, thickening agents such as orben, benton and so on, silicone-based, fluorine-based and polymer-based defoaming agents or leveling agents, adhesiveness imparting agents such as imidazoles, thiazoles, triazoles, silane coupling agents and so on, and coloring agents such as phthalocyanine blue, phthalocyanine green, iodine green, disazo yellow, carbon black and so on.

As the support film and the protective film in the invention, polyolefins such as polyethylene, polypropylene, poly-vinyl chloride, and so on; polyesters such as polyethylene terephthalate (hereinafter, in some cases, referred to as "PET"), polyethylene naphthalate, and so on; polycarbonate; polyimide; further release paper; aluminum foil; and so on can be exemplified. The support film and the protective film may be subjected to mold release treatment such as matte treatment, corona discharge treatment, disposition of a silicone releasing film layer, and so on.

The thickness of the support film is not particularly restricted and is usually in the range of from 10 to 150 μm, and preferably in the range of from 25 to 50 μm. Furthermore, the thickness of the protective film is preferably in the range of from 1 to 40 μm. As described below, a support film that is used as a support in the manufacturing step of the adhesive film can be used as a protective film that protects the surface of the layer B.

The support film in the present invention is peeled after the adhesive film according to the present invention is laminated onto a circuit board or heated and cured and thereby forming an insulating layer. When the support film is peeled after the adhesive film is heated and cured, during the curing step, dust or the like can be inhibited from sticking. When the support film is peeled after the curing, the support film is in advance subjected to the mold release treatment such as disposing a silicone mold release film layer and so on.

The resin composition layer made of the layer A and the layer B that is formed on the support film is preferably formed so that the area of the layer may be smaller than the area of the peelable support film.

The thermosetting resin composition constituting the thermosetting resin composition layer that contains the layer A and the layer B or the layer B in the present invention allows filling the resin inside of the through holes and/or via holes simultaneously with laminating to the circuit board by means of the vacuum lamination. Such thermosetting resin compositions soften under a temperature condition (normally from 70 to 140° C.) in the vacuum lamination, exhibits preferable fluidity (resin flow), and when there are through holes or via holes, allows filling the resin in the holes in a lump and simultaneously. Such physical properties can be characterized by a temperature-melt viscosity curve due to measurements of the dynamic viscoelastic modulus of the thermosetting resin composition.

Figure 1:
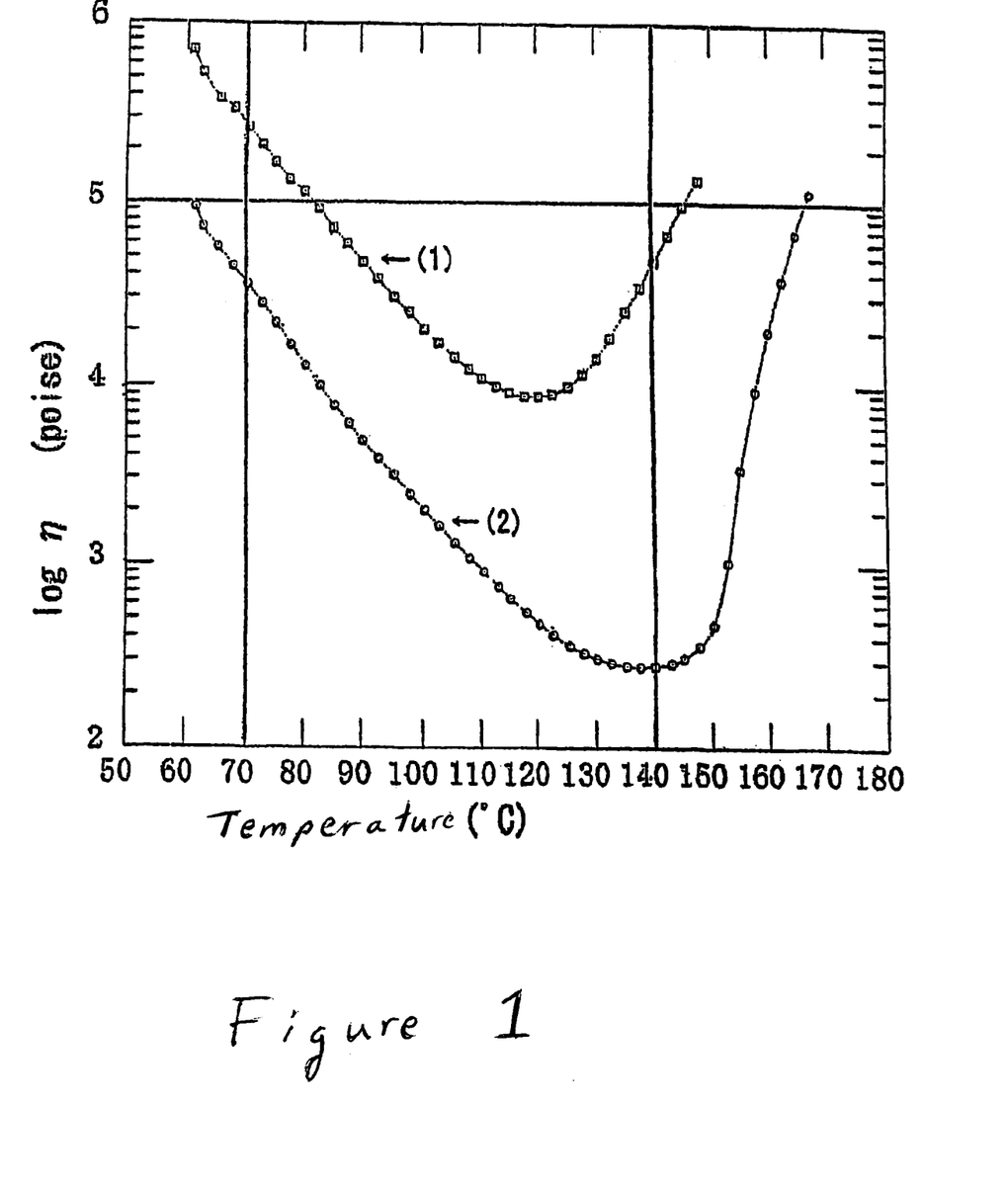
FIG. 1 shows the results of the measurements of the dynamic viscoelastic modulus of the thermosetting resin composition prepared in Reference Example 1 under two different kinds of drying conditions.

By measuring the dynamic viscoelastic modulus based on thermosetting resin compositions that are obtained according to Reference Example 1 described below, an example of relationship between temperature-melt viscosity (η) preferable as the thermosetting resin composition in the invention is shown in FIG. 1. The melt viscosity of the thermosetting resin composition when heated with the measurement start temperature set at 60 degree centigrade and the temperature rise rate set at 5 degree centigrade/minute is shown as a curve. From the drawing, as the characteristics of the thermosetting resin composition preferable for the invention, when correlation of the temperature-melt viscosity is measured under the same conditions, ones of which melt-viscosities at the respective temperatures are in the range shown in Table 1 below, more preferably ones whose melt viscosities are in the range shown in Table 2 can be taken as the thermosetting resin compositions preferable for the present invention.

TABLE 1

| Temperature (degree centigrade) | Melt viscosity (poise) |
| --- | --- |
| 90 | From 4,000 to 50,000 |
| 100 | From 2,000 to 21,000 |
| 110 | From 900 to 12,000 |
| 120 | From 500 to 9,000 |
| 130 | From 300 to 15,000 |

TABLE 2

| Temperature (degree centigrade) | Melt viscosity (poise) |
| --- | --- |
| 90 | From 10,000 to 25,000 |
| 100 | From 5,000 to 10,000 |
| 110 | From 2,000 to 6,000 |
| 120 | From 1,000 to 5,000 |
| 130 | From 600 to 3,000 |

The method of the manufacturing the adhesive film according to the present invention will now be explained.

As a method of forming a resin composition layer (a resin composition layer made of layers A and B) of the present invention, a resin varnish in which a resin composition is dissolved in an organic solvent as illustrated above is prepared, with a support film (layer C) as a support, and the resin varnish is coated on the support film, followed by heating or blowing a hot air or the like to dry the organic solvent, and thereby a layer can be formed. The organic solvent, as needs arise, may be a combination of two or more kinds.

In more detail, first, after a thermosetting resin composition that constitutes the layer A is dissolved in an organic solvent and thereby a resin varnish is prepared, the resin varnish is coated on a film (layer C) that is a support, the solvent is dried by blowing a hot air or the like, and thereby a layer A having a predetermined thickness is formed. Preferably, on the layer A, a resin varnish obtained by dissolving a thermosetting resin composition that constitutes the layer B in an organic solvent is coated followed by drying by blowing a hot air or the like, thereby a layer B having the above-mentioned predetermined thickness is formed, and thereby an adhesive film having a configuration of layer C/layer A/layer B is manufactured. Furthermore, when a protective film (layer D) similar to the support film is further laminated on a surface that is not in contact with the layer A of the layer B, an adhesive film having a configuration of layer C/layer A/layer B/layer D is obtained. The adhesive film can be wound in roll and stored.

Furthermore, layer A and layer B each are separately coated on a support film (layer C) and dried, thereby dried two-layered films are prepared, thereafter the layer A and the layer B are adhered, and thereby an adhesive film having a configuration of layer C/layer A/layer B/layer C can be formed. In this case, the support film (layer C) adjacent to the layer B also becomes a protective film (layer D) (that is, it becomes an adhesive film having a configuration of layer C/layer A/layer B/layer D).

In the resin composition layer made of the layer A and the layer B, the layer A and the layer B are not necessarily adjacent to each other; alternatively, another resin layer such as a resin layer made of polyimide, liquid crystal polymer, aramid resin, polyphenylene sulfide and so on (a thickness in the range of for instance from 2 to 30 μm) may be interposed between the layer A and the layer B.

The method of laminating the adhesive film according to the present invention onto a circuit board will now be explained.

When the layer B is protected with the protective film (layer D) or the support film (layer C), after peeling these, the adhesive film is laminated on a single surface or both surfaces of the circuit board while keeping the layer B directly in contact with the circuit board. With the adhesive film according to the invention, a method of laminating onto the circuit board according to the vacuum lamination is preferably used.

The laminating method may be a batch system or a continuous system with a roll. Furthermore, before being subjecting to lamination, the adhesive film and the circuit board, if necessary, may be heated (preheated). The lamination conditions are as mentioned above.

The vacuum lamination can be carried out with commercially available vacuum laminators. As the commercially available vacuum laminators, for instance, "Vacuum Applicator" manufactured by Nichigo Morton Co., Ltd., "Vacuum Pressing Laminator" manufactured by Meiki Co., Ltd., "Roll Type Dry Coater" manufactured by Hitachi Techno Engineering Co., Ltd., "Vacuum Laminator" manufactured by Hitachi AIC, Inc., and so on can be exemplified.

The term circuit board as used in the present invention includes ones in which on a single surface or both surfaces of a board of mainly such as glass epoxy, metal board, polyester board, polyimide board, BT resin board, thermosetting polyphenylene ether board, and so on, a patterned conductor layer (circuit) is formed. Furthermore, a multilayer printed wiring board in which a conductor layer and an insulating layer are alternately stacked and a single surface or both surfaces thereof are patterned conductor layers (circuit) is also included within the term circuit board as used according to the present invention. It is preferable from a viewpoint of adhesiveness to the circuit board of the insulating layer that a surface of the conductor circuit layer is previously subjected to a roughening by means of the blackening treatment or the like.

The support film may be peeled after the lamination.

When the adhesive film is thus laminated on the circuit board followed by thermally curing, an insulating layer can be formed on the circuit board. As to the thermally curing conditions, though different depending on the resins, the curing temperature is usually selected in the range of from 100 to 200° C. and the curing time period is usually selected in the range of from 10 to 90 minutes. When the curing is performed by raising the curing temperature from a relatively low curing temperature to a higher curing temperature, the generation of wrinkles on a surface of the formed insulating layer and voids in holes can be preferably inhibited from occurring. When the support film is peeled after the thermally curing, from a viewpoint of the difference of the thermal expansion coefficients between the resin and the support film, it is preferable to peel the support film after applying two-step curing, that is, first in the range of substantially from 80 to 120° C. for substantially from 10 to 30 minutes, subsequently in the range of substantially from 150 to 200° C. for substantially from 10 to 60 minutes.

After the insulating layer is thus formed on the circuit board, the following steps (i) through (v) are sequentially carried out, and thereby a multilayer printed wiring board can be produced.

(i) a step of peeling a support film when the support film is present, (ii) a step of drilling the circuit board thereon the insulating layer is formed, (iii) a step of roughening a surface of the insulating layer with an alkaline permanganic acid solution, (iv) a step of forming a conductor layer by a plating on the roughened surface of the insulating layer, and (v) a step of forming a circuit in the conductor layer.

In more detail, when the support film is present after the curing, the support film is peeled. Subsequently, holes are drilled in the insulating layer formed on the circuit board, and thereby via holes and through holes are formed. The drilling can be performed by means of known methods such as a drill, laser, plasma and so on, or if necessary, a combination thereof. Among these, in view of forming holes smaller in diameter, the laser method is preferable.

Subsequently, the surface of the insulating layer is subjected to a roughening treatment. As the roughening treatment, the roughening treatment that is generally used as means for roughening the insulating layer in the production of the multilayer printed wiring board according to the build-up technique and that uses an alkaline permanganic acid solution such as an aqueous solution of sodium hydroxide of potassium permanganate, sodium permanganate is applied, and thereby the surface of the layer A is roughened.

In the next place, on the surface of the layer A thereon anchors of bumpy surface are formed according to the roughening treatment, a conductor layer is formed by use of a method in which, for instance, electroless plating and electrolytic plating are combined. Furthermore, by forming a plating resist with a pattern reverse to the conductor layer, a conductor layer can be formed with electroless plating alone. By annealing at a temperature of from 150 to 200° C. for from 20 to 90 minutes, after the formation of the conductor layer, the peel strength of the conductor layer can be improved and stabilized.

Furthermore, for example, a subtractive method, a semi-additive method, and so on that are known to one skilled in the art can also be used as a method of patterning a conductor layer to form a circuit.

Other features of the invention will become apparent in the course of the following descriptions of exemplary embodiments which are given for illustration of the invention and are not intended to be limiting thereof.

EXAMPLES

In the following examples, all "parts" are parts by weight.

Reference Example 1

Twenty parts of liquid bisphenol A type epoxy resin ("Epikote 828EL" manufactured by Japan Epoxy Resin Co., Ltd. and having an epoxy equivalent of 185), 20 parts of brominated bisphenol A type epoxy resin ("YD-500" manufactured by Tohto Kasei Co., Ltd. and having an epoxy equivalent of 500), 20 parts of cresol novolak type epoxy resin ("EPICLON N-673" manufactured by Dainippon Ink and Chemicals, Inc. and having an epoxy equivalent of 215), and 15 parts of end-epoxidated polybutadiene rubber ("Denarex R-45EPT" manufactured by Nagase Kasei Kogyo K.K.) were dissolved into methyl ethyl ketone under heating with stirring. Thereto, 50 parts of brominated phenoxy resin varnish ("YPB-40-PXM40" manufactured by Tohto Kasei Co., Ltd., containing a nonvolatile component of 40% by weight and having a solvent composition of xylene: methoxypropanol: methyl ethyl ketone=5:2:8), 4 parts of 2,4-diamino-6-(2-methyl-1-imidazolylethyl)-1,3,5-trazine isocyanuric acid adduct (as an epoxy curing agent), 2 parts of finely crushed silica, 4 parts of antimony trioxide, and 5 parts of calcium carbonate were added, and thereby a resin varnish of a thermosetting resin composition was prepared.

The resin varnish was coated by use of a die coater on a polyimide film of which both surfaces had been plasma-treated ("Upilex S" manufactured by Ube Industries, Ltd. (thickness: 12.5 µm, and glass transition point: 500° C. or more)) so that a dry thickness of the resin might be 60 µm, dried in the range of from 80 to 120° C. (100° C. on the average) for substantially 8 minutes (amount of residual solvent: substantially 2% by weight), followed by winding in a roll while superposing a polypropylene film having a thickness of 15 µm on a surface of the dried thermosetting resin composition. The roll-like adhesive film was slit into a width of 507 mm, and therefrom a sheet-like adhesive film having a size of 507×336 mm was obtained. The obtained adhesive film has a layer composition of polypropylene film layer (protective film layer)/thermosetting resin composition layer/polyimide film layer (heat resistant resin layer).

The dynamic viscoelastic modulus of the obtained thermosetting resin composition was measured. The results are shown in FIG. 1. Measurements were performed by use of "Dynamic Rheometer Rheosol-G3000" manufactured by UBM Co., Ltd.

In FIG. 1, the upper dynamic viscoelastic modulus curve (1) is the one for the thermosetting resin composition layer that was obtained by coating the resin varnish of the thermosetting resin composition followed by heating and drying at an average drying temperature of 100° C. for 10 minutes. Furthermore, the lower dynamic viscoelastic modulus curve (2) is the one for the thermosetting resin composition layer that was obtained by coating the resin varnish of the thermosetting resin composition followed by heating and drying at an average drying temperature of 100° C. for 3.5 minutes. Measurements were carried out with the temperature rise rate during the measurement set at 5° C./minute, the measurement starting temperature at 60° C., a measuring temperature interval at 2.5° C., and a vibration at 1 Hz/deg. Selected measurements are shown in Table 3 below.

TABLE 3

| Temperature (degree centigrade) | Melt viscosity (poise) |
| --- | --- |
| 70 | From 35,000 to 265,000 |
| 80 | From 12,900 to 114,500 |
| 90 | From 4,900 to 46,400 |
| 100 | From 2,000 to 20,400 |
| 110 | From 900 to 11,100 |
| 120 | From 470 to 8,800 |
| 130 | From 300 to 14,200 |
| 140 | From 280 to 46,800 |

Reference Example 2

Figure 2:
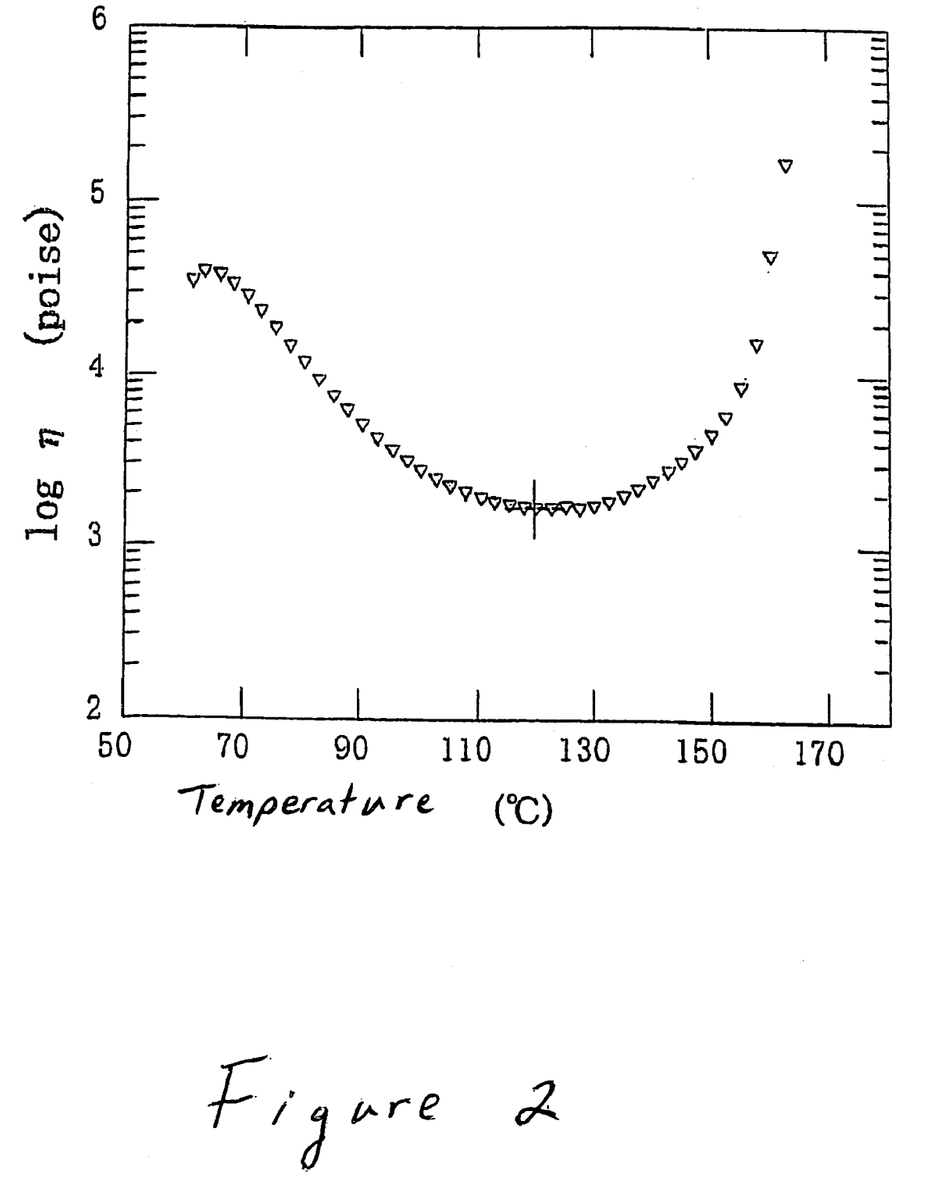
FIG. 2 shows the results of the measurements of the dynamic viscoelastic modulus of the thermosetting resin composition prepared in Example 1.

The dynamic viscoelastic modulus of the thermosetting resin composition made of a layer A and a layer B prepared according to Example 1 described below (two-layered film, having a thickness of: 10 µm+50 µm=60 µm) was measured. The measurements were performed by use of "Dynamic Rheometer Rheosol-G3000" manufactured by UBM Co., Ltd. the same as that used in Reference Example 1. Similarly to Reference Example 1, the measurements were carried out with the temperature rise rate during the measurement set at 5° C./minute, the measurement starting temperature at 60° C., a measuring temperature interval at 2.5° C., and a vibration at 1 Hz/deg.

The results are shown in FIG. 2.

Example 1

Preparation of an Adhesive Film (layer A): Twenty parts of liquid bisphenol A type epoxy resin ("Epikote 828EL" manufactured by Japan Epoxy Resin Co., Ltd. and having an epoxy equivalent of 185), 20 parts of brominated bisphenol A type epoxy resin ("YD-500" manufactured by Tohto Kasei Co., Ltd. and having an epoxy equivalent of 500), 20 parts of cresol novolak type epoxy resin ("EPICLON N-673" manufactured by Dainippon Ink and Chemicals, Inc. and having an epoxy equivalent of 215), and 15 parts of end-epoxidated polybutadiene rubber ("Denarex R-45EPT" manufactured by Nagase Kasei Kogyo K.K.) were dissolved in methyl ethyl ketone under heating with stirring. Thereto, 50 parts of brominated phenoxy resin varnish ("YPB-40-PXM40" manufactured by Tohto Kasei Co., Ltd. containing a nonvolatile component by 40% by weight and having a solvent composition of xylene: methoxypropanol: methyl ethyl ketone=5:2:8), 4 parts of 2,4-diamino-6-(2-methyl-1-imidazolylethyl)-1,3,5-triazine isocyanuric acid adduct (as an epoxy curing agent), 1.5 parts of finely crushed silica (aerosil), and 16 parts of molten spherical silica particles having an average particle diameter of 1.5 μm and obtained by classifying coarse particles of 10 μm or more to 100 ppm or less were added, and thereby a resin varnish of a thermosetting resin composition was prepared (amount of inorganic filler: 15% by weight).

(layer B): Thirty parts of liquid bisphenol F type epoxy resin ("Epikote 807" manufactured by Japan Epoxy Resin Co., Ltd. and having an epoxy equivalent of 170), 20 parts of brominated phenoxy resin varnish ("YPB-40-PXM40" manufactured by Tohto Kasei Co., Ltd. containing a nonvolatile component by 40% by weight and having a solvent composition of xylene: methoxypropanol: methyl ethyl ketone=5:2:8), 20 parts by weight of MEK varnish of triazine structure-containing phenol novolak resin ("Phenolite LA-7052" manufactured by Dainippon Ink and Chemicals, Inc. having a nonvolatile component of 60% and a phenolic hydroxide equivalent of the nonvolatile component of 120) (as an epoxy curing agent), and 120 parts of molten spherical silica particles having an average particle diameter of 4 μm were added, and thereby a resin varnish of a thermosetting resin composition was prepared (amount of inorganic filler: 70% by weight).

First, the resin varnish that constitutes the layer A was coated by use of a die coater on a polyethylene terephthalate (having a thickness of 38 μm, hereinafter abbreviated to as "PET") so that a dry resin thickness might be 10 μm, dried in the range of from 80 to 120° C. (100° C. on the average) for 2 minutes. On the resin composition, successively the resin varnish that constitutes the layer B was similarly coated so that a dry resin thickness might be 50 μm, and dried in the range of from 80 to 120° C. (100° C. on the average) for 6 minutes (amount of residual solvent: substantially 1% by weight). The result of measurements of the dynamic viscoelastic modulus of the thus-obtained thermosetting resin composition made of the layer A and the layer B are shown in FIG. 2 (See Reference Example 2).

Subsequently, the thermosetting resin composition was wound into roll while superposing a polypropylene film having a thickness of 15 μm on a surface of the thermosetting resin composition of the layer B. The roll-like adhesive film was slit into a width of 507 mm, and therefrom a sheet-like adhesive film having a size of 507×336 mm was obtained.

The obtained adhesive film has a layer composition of polypropylene film layer (protective film layer)/layer B/layer A/PET layer (support base film layer).

Example 2

Preparation of an Adhesive Film

The resin varnish that constitutes the layer A described in Example 1 was coated by use of a die coater on a release-treated PET film having a thickness of 38 μm so that a dry thickness might be 10 μm, dried in the range of from 80 to 120° C. for 2 minutes, and thereby an adhesive film having an layer A/releasing PET layer was obtained (amount of residual solvent: substantially 1% by weight).

Furthermore, the resin varnish that constitutes the layer B described in Example 1 was coated by use of a die coater on a release-treated PET film having a thickness of 25 μm so that a dry thickness might be 50 μm, dried in the range of from 80 to 120° C. for 6 minutes, and thereby an adhesive film having a layer B/releasing PET layer was obtained (amount of residual solvent: substantially 1% by weight).

Subsequently, on surfaces of the layer A and the layer B of the film, an aramid film having a thickness of 4.5 μm was affixed by use of a hot roll, and thereby an adhesive film having a configuration of releasing PET layer/layer A/aramid film/layer Blayer/releasing PET layer was obtained.

Comparative Example 1

Preparation of an Adhesive Film

The resin varnish that constitutes the layer A described in Example 1 was coated by use of a die coater on a PET film having a thickness of 38 μm so that a dry thickness might be 60 μm, dried in the range of from 80 to 120° C. for 8 minutes, and thereby an adhesive film having a polypropylene film layer/layer A/PET layer was obtained (amount of residual solvent: substantially 2% by weight).

Comparative Example 2

Preparation of an Adhesive Film

The resin varnish that constitutes the layer B described in Example 1 was coated by use of a die coater on a PET film having a thickness of 38 μm so that a dry thickness might be 60 μm, dried in the range of from 80 to 120° C. for 8 minutes, and thereby an adhesive film having a polypropylene film layer/layer B/PET layer was obtained (amount of residual solvent: substantially 1% by weight).

Example 3

Preparation of a Four Layer Printed Wiring Board

From a FR4 laminate board that is plated on both surfaces with a copper foil of 18 μm and has a board thickness of 0.3 mm, an inner layer circuit board was prepared (having through holes having a diameter of 0.2 mm). The adhesive film obtained according to Example 1, after the polypropylene film was peeled off, was laminated on both surfaces of the circuit board, with the layer B directed to the circuit board, by use of a vacuum laminator manufactured by Meiki Co., Ltd. using the conditions of a temperature of 100° C., a pressure of 5 kgf/cm², and an air pressure of 5 mmHg or less. Subsequently, the PET film was peeled followed by thermally curing at 150° C. for 30 minutes. Thereafter, holes were drilled by use of a laser to form via holes followed by roughening the surface of the A layer that had been cured with an alkaline oxidizing agent of permanganate further, followed by electroless plating and the electrolytic plating, and thereby according to the subtractive method a four layer printed wiring board was obtained. Thereafter, annealing was further applied at 170° C. for 30 minutes.

The peel strength of the obtained conductor layer was 1 kgf/cm. The peel strength measurement was evaluated according to Japanese Industrial Standard (JIS) C6481 and the thickness of the conductor plating was substantially 30 μm.

Example 4

Preparation of a Four Layer Printed Wiring Board

A four layer printed wiring board was prepared, similar to as described in Example 3, with the exception of using the adhesive film obtained according to Example 2. The peel strength of the obtained conductor layer was 1 kgf/cm.

Comparative Example 3

Preparation of a Four Layer Printed Wiring Board

A four layer printed wiring board was prepared, similar to as described in Example 3, with the exception of using the adhesive film obtained according to Comparative Example 2. The peel strength of the obtained conductor layer was 1 kgf/cm.

Comparative Example 4

Preparation of a Four Layer Printed Wiring Board

A four layer printed wiring board was prepared, similar to as described in Example 3, with the exception of using the adhesive film obtained according to Comparative Example 3. The peel strength of the obtained conductor layer was 0.3 kgf/cm.

Evaluation of Thermal Expansion Coefficient

Thermosetting resin composition surfaces of the adhesive films obtained according to Examples 1 and 2 and Comparative Examples 1 and 2 were cured at 170° C. for 90 minutes. Samples of cured product were cut into test pieces having a width of substantially 5 mm and a length of substantially 15 mm. TMA measurements were carried out under a tensile mode with a Thermomechanical Analyzer (TMA) manufactured by Rigaku Corporation. Under a weight of 1 g and a temperature rise rate of 5° C./minute, measurements were repeated twice. The linear expansion coefficients averaged over from room temperature (23° C.) to 150° C. in the second measurement are shown in Table 4.

TABLE 4

| Multilayer printed wiring board | Example 3 | Example 4 | Comparative Example 3 | Comparative Example 4 |
| --- | --- | --- | --- | --- |
| Peel strength (kgf/cm) | 1 | 1 | 1 | 0.3 |
| Thermal expansion coefficient (ppm) | 30 | 20 | 90 | 26 |

From Table 4, it was found that the adhesive films according to the present invention easily permit the introduction of insulating layers that have a low thermal expansion coefficient and exhibit excellent adhesiveness with the conductor layer.

In contrast, as seen from Comparative Example 3, when the content of the inorganic filler is small, though excellent adhesiveness with the conductor layer is obtained, the thermal expansion coefficient is large. On the other hand, as shown in Comparative Example 4, when the inorganic filler content is high, although a low thermal expansion coefficient is obtained, the adhesiveness with the conductor layer is poor; accordingly, it could not be practically used as a the multilayer printed wiring board.

INDUSTRIAL APPLICABILITY

According to the present invention, when a multilayer printed wiring board is produced according to a build-up technique, an insulating layer that, under lamination conditions, allows filling a resin inside a through hole and/or a via hole simultaneously with laminating a circuit board, has a low thermal expansion coefficient of the formed insulating layer, and after roughening a surface of the insulating layer, is excellent also in the adhesiveness with a conductor layer formed by use of the plating can be easily introduced.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A process of making a laminated circuit board, comprising laminating a circuit board with an adhesive film, wherein:
   said adhesive film is formed by laminating a resin composition layer comprising a layer A and a layer B on a support base film; wherein:
   layer A is a layer of a thermosetting resin composition which comprises an epoxy resin having two or more epoxy groups in one molecule and an epoxy curing agent, and has an inorganic filler content of less than 40% by weight, and after thermal curing has a cured surface that, which after roughening with an alkaline permanganic acid solution, allows forming a conductor layer by plating, and is solid at ambient temperature;
   layer B is a layer of a thermosetting resin composition that comprises an epoxy resin having two or more epoxy groups in one molecule, an epoxy curing agent, and an inorganic filler, selected from the group consisting of silica and alumina, in an amount of more than 40% by weight, and is solid at ambient temperature;
   said layer A is laminated adjacent to said support base film;

said resin composition layer or said layer B, under lamination conditions, has a fluidity capable of filling a resin in a through hole and/or a via hole simultaneously with laminating said circuit board; and said laminating of said circuit board with said adhesive film is carried out while keeping said layer B directly in contact with said circuit board, wherein said support film is removed prior to any roughening.

2. The process of making a laminated circuit board of claim 1, wherein said layer B comprises 10% by weight or more, based on the total weight of said layer B, of a resin which has a softening point lower than the temperature of said lamination.

3. The process of making a laminated circuit board of claim 1, wherein said layer B comprises a component that is liquid at ambient temperature in an amount of from 5 to 55% by weight, based on the total weight of said layer B.

4. The process of making a laminated circuit board of claim 1, wherein said layer B comprises a polymer compound having a weight average molecular weight in the range of from 5,000 to 100,000 in an amount of from 5 to 50% by weight, based on the total weight of said layer B.

5. The process of making a laminated circuit board of claim 1, wherein said laminating of said circuit board is carried out under conditions of a temperature of from 70 to 140° C., a pressure of from 1 to 20 kgf/cm$^2$, and an air pressure of 20 mmHg or less.

6. The process of making a laminated circuit board of claim 1, wherein said layer A has a thickness in the range of from 1 to 20 μm and said layer B has a thickness of from 10 to 100 μm.

7. The process of making a laminated circuit board of claim 1, wherein said layer B is adjacent to said layer A.

8. The process of making a laminated circuit board of claim 1, wherein said layer B is protected with a protective film and said process further comprises peeling said protective film before said laminating of said circuit board.

9. The process of making a laminated circuit board according to any one of claims 1 to 8, further comprising, after said laminating of said circuit board, optionally peeling said support film if necessary, and thermally curing said adhesive film, to thereby obtain an insulating layer.

10. A process of making a multilayer printed wiring board, comprising making a laminated circuit board according to claim 9 and further comprising sequentially:
(i) peeling said support film when said support film is present;
(ii) drilling said circuit board;
(iii) roughening a surface of said insulating layer with an alkaline permanganic acid solution, to obtain a roughened surface;
(iv) forming a conductor layer on said roughened surface of said insulating layer by plating; and
(v) forming a circuit in said conductor layer.

11. A process of making a multilayer printed wiring board, comprising laminating a circuit board according to the process of any one of claims 1 through 8.

12. A process of making a multilayer printed wiring board, comprising laminating a circuit board according to the process of claim 9.

13. The process of claim 1, wherein said layer A further comprises a roughening component.

14. The process of claim 13, wherein said roughening component is at least one member selected from the group consisting of calcium carbonate, magnesium carbonate, magnesium oxide, aluminum hydroxide, a polybutadiene rubber, an epoxidated polybutadiene rubber, an urethane-modified polybutadiene rubber, an acrylonitrile-modified polybutadiene rubber, a methacrylonitrile-modified polybutadiene rubber, an acrylonitrile butadiene rubber having a carboxyl group, a methacrylonitrile butadiene rubber having a carboxyl group, an acrylic rubber dispersed epoxy resin, a melamine resin, an alkyl etherified melamine resin, a guanamine resin, an alkyl etherified guanamine resin, an urea resin, an alkyl etherified urea resin, a powdery epoxy resin, a crosslinked acrylic polymer, and a phenoxy resin.

15. The process of claim 13, wherein said layer A comprises said roughening component in an amount of from 5 to less than 40% by weight, based on the total weight of the layer A.

16. The process of claim 1, wherein said layer A has an inorganic filler content of from 1 to 35% by weight, based on the total weight of layer A.

17. The process of claim 1, wherein said layer A has an inorganic filler content of from 5 to 25% by weight, based on the total weight of layer A.

18. The process of claim 1, wherein said layer B comprises said inorganic filler in an amount of from 50 to 90% by weight, based on the total weight of layer B.

19. A process of making a laminated a circuit board, comprising laminating a circuit board with an adhesive film, wherein:

said adhesive film is formed by laminating a resin composition layer comprising a layer A and a layer B on a support base film; wherein:

layer A is a layer of a thermosetting resin composition which comprises an epoxy resin having two or more epoxy groups in one molecule an epoxy curing agent, and has an inorganic filler content of less than 40% by weight, and after thermal curing has a cured surface that, after roughening with an alkaline permanganic acid solution, allows forming a conductor layer by plating, and is solid at ambient temperature, and layer B is a layer of a thermosetting resin composition which comprises an epoxy resin having two or more epoxy groups in one molecule, an epoxy curing agent, and an inorganic filler, selected from the group consisting of silica and alumina, in an amount of more than 40% by weight, and is solid at ambient temperature;

said layer A layer is laminated adjacent to said support base film;

said resin composition layer or said layer B has a melt viscosity, when it is heated with a measurement start temperature of 60° C. and a temperature rise rate of 5° C. centigrade/minute, in a range of from 4,000 to 50,000 poise at 90° C., from 2,000 to 21,000 poise at 100° C., from 900 to 12,000 poise at 110° C., from 500 to 9,000 poise at 120° C. and from 300 to 15,000 poise at 130° C.;

said laminating of said circuit board with said adhesive film is carried out while keeping said layer B directly in contact with said circuit board;

wherein said support film is removed prior to any roughening.

20. The process of claim 19, wherein said layer B comprises said inorganic filler in an amount of from 50 to 90% by weight, based on the total weight of layer B.

21. The process of making a laminated a circuit board of claim 19, wherein said laminating is carried out under conditions of a temperature of from 70 to 140° C., a pressure of from 1 to 20 kgf/cm², and an air pressure of 20 mmHg or less.

22. The process of making a laminated a circuit board of claim 19, wherein said layer A has a thickness in the range of from 1 to 20 μm and said layer B has a thickness of from 10 to 100 μm.

23. The process of making a laminated a circuit board of claim 19, wherein said layer B is adjacent to said layer A.

24. The process of making a laminated a circuit board of claim 19, wherein said layer B is protected with a protective film and further comprising peeling said protective film before said laminating of said circuit board.

25. The process of making a laminated circuit board according to any one of claims 19 to 24, further comprising, after said laminating of said circuit board, optionally peeling said support film if necessary, and thermally curing said adhesive film, to thereby obtain an insulating layer.

26. A process of making a multilayer printed wiring board, comprising making a laminated circuit board according to claim 25 and further comprising sequentially:
 (i) peeling said support film when said support film is present;
 (ii) drilling said circuit board;
 (iii) roughening a surface of said insulating layer with an alkaline permanganic acid solution, to obtain a roughened surface;
 (iv) forming a conductor layer on said roughened surface of said insulating layer by plating; and
 (v) forming a circuit in said conductor layer.

27. A process of making a multilayer printed wiring board, comprising laminating a circuit board according to the process of any one of claims 19 through 24.

28. A method of producing a multilayer printed wiring board, comprising laminating a circuit board according to the process of claim 25.

29. The process of claim 19, wherein said layer A further comprises a roughening component.

30. The process of claim 29, wherein said roughening component is at least one member selected from the group consisting of calcium carbonate, magnesium carbonate, magnesium oxide, aluminum hydroxide, a polybutadiene rubber, an epoxidated polybutadiene rubber, an urethane-modified polybutadiene rubber, an acrylonitrile-modified polybutadiene rubber, a methacrylonitrile-modified polybutadiene rubber, an acrylonitrile butadiene rubber having a carboxyl group, a methacrylonitrile butadiene rubber having a carboxyl group, an acrylic rubber dispersed epoxy resin, a melamine resin, an alkyl etherified melamine resin, a guanamine resin, an alkyl etherified guanamine resin, an urea resin, an alkyl etherified urea resin, a powdery epoxy resin, a crosslinked acrylic polymer, and a phenoxy resin.

31. The process of claim 29, wherein said layer A comprises said roughening component in an amount of from 5 to less than 40% by weight, based on the total weight of the layer A.

32. The process of claim 19, wherein said layer A has an first inorganic filler content of from 1 to 35% by weight, based on the total weight of layer A.

33. The process of claim 19, wherein said layer A has an first inorganic filler content of from 5 to 25% by weight, based on the total weight of layer A.

* * * * *